United States Patent
Wu

(10) Patent No.: US 8,467,030 B2
(45) Date of Patent: Jun. 18, 2013

(54) TRANSISTOR ARRAY SUBSTRATE

(75) Inventor: Chi-Liang Wu, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 100 days.

(21) Appl. No.: 13/008,334

(22) Filed: Jan. 18, 2011

(65) Prior Publication Data

US 2012/0104391 A1     May 3, 2012

(30) Foreign Application Priority Data

Nov. 3, 2010   (TW) ................. 99137793 A

(51) Int. Cl.
  *H01L 27/00* (2006.01)
(52) U.S. Cl.
  USPC .......................................... 349/199; 257/79
(58) Field of Classification Search
  USPC .......................................... 349/199; 257/79
  See application file for complete search history.

(56) References Cited

U.S. PATENT DOCUMENTS 7,839,478 B2 * 11/2010 Lee et al. ................. 349/149
2007/0012897 A1 * 1/2007 Lee et al. ................. 252/299.1

FOREIGN PATENT DOCUMENTS

JP     2007232982     9/2007

* cited by examiner

*Primary Examiner* — Howard Weiss
*Assistant Examiner* — Steven Rao
(74) *Attorney, Agent, or Firm* — WPAT, PC; Justin King

(57) ABSTRACT

A transistor array substrate includes a substrate, a pixel array, a plurality of resistors, and a plurality of semiconductor transistors. The pixel array, the resistors, and the semiconductor transistors are all disposed on the substrate. The pixel array includes a plurality of scan lines. Each resistor is electrically connected to one of the scan lines, and each semiconductor transistor is electrically connected to one of the scan lines and one of the resistors. The scan lines can receive a first voltage and a second voltage. The second voltage is higher than the first voltage.

7 Claims, 3 Drawing Sheets

TRANSISTOR ARRAY SUBSTRATE

CROSS-REFERENCE TO RELATED APPLICATION

This application claims the benefit of Taiwan Patent Application No. 099137793, filed on Nov. 3, 2010, which is hereby incorporated by reference for all purposes as if fully set forth herein.

BACKGROUND OF THE INVENTION

1. Field of Invention

The present invention relates to an active device array substrate applied in a display, and more particularly to a transistor array substrate.

2. Related Art

Currently, a liquid crystal display (LCD) generally displays images by using a plurality of semiconductor transistors. Generally, the LCD usually has a plurality of liquid crystal capacities, and the liquid crystal capacities are formed by a plurality of pixel electrodes, a liquid crystal layer, and a color filter substrate. The semiconductor transistors can input currents to the liquid crystal capacities, so as to charge the liquid crystal capacities. In this manner, liquid crystal molecules in the liquid crystal layer are driven to rotate, to prompt the images displayed by the LCD.

In the above description, the current input from the semiconductor transistor to the liquid crystal capacity is basically in direct proportion to the electron mobility in the semiconductor transistor, and the electron mobility is subject to variations of the temperature. When the semiconductor transistors are in a high-temperature environment, the electron mobility rises, and the currents input to the liquid crystal capacities are also increased. When the semiconductor transistors are in a low-temperature environment, the electron mobility falls, and the currents input to the liquid crystal capacities are also decreased.

Therefore, when the LCD is in the low-temperature environment, the currents received by the liquid crystal capacities from the semiconductor transistors will be decreased, thereby easily causing inadequate charging in the liquid crystal capacities. Once inadequate charging occurs in the liquid crystal capacities, the LCD cannot display correct gray-level colors, resulting in color distortion occurring in the images displayed by the LCD.

SUMMARY OF THE INVENTION

The present invention is directed to a transistor array substrate for reducing the happening of inadequate charging in the liquid crystal capacities when the LCD is in the low-temperature environment.

The present invention provides a transistor array substrate. The transistor array substrate includes a substrate, a pixel array, a plurality of resistors, a plurality of semiconductor transistors. The pixel array is disposed on the substrate and includes a plurality of scan lines. The resistors are disposed on the substrate, wherein each resistor is electrically connected to one of the scan lines. The semiconductor transistors are disposed on the substrate, wherein each semiconductor transistor is electrically connected to one of the scan lines and one of the resistors. The scan lines are capable of receiving a first voltage and a second voltage, and the second voltage is higher than the first voltage.

Through the semiconductor transistors, the resistors, and the electron mobility in the semiconductor transistors varying with the temperature, when the LCD is in a low-temperature environment, the present invention can improve the charging capability of the pixel transistor to the liquid crystal capacities, thereby further reducing the happening of inadequate charging in the liquid crystal capacities.

In order to make the above characteristics and advantages of the present invention clearer, preferred embodiments of the present invention are described in detail hereinafter with reference to the accompanying drawings.

BRIEF DESCRIPTION OF THE DRAWINGS

The present invention will become more fully understood from the detailed description given herein below for illustration only, and thus are not (imitative of the present invention, and wherein.

DETAILED DESCRIPTION OF THE EMBODIMENTS

Figure 1A:
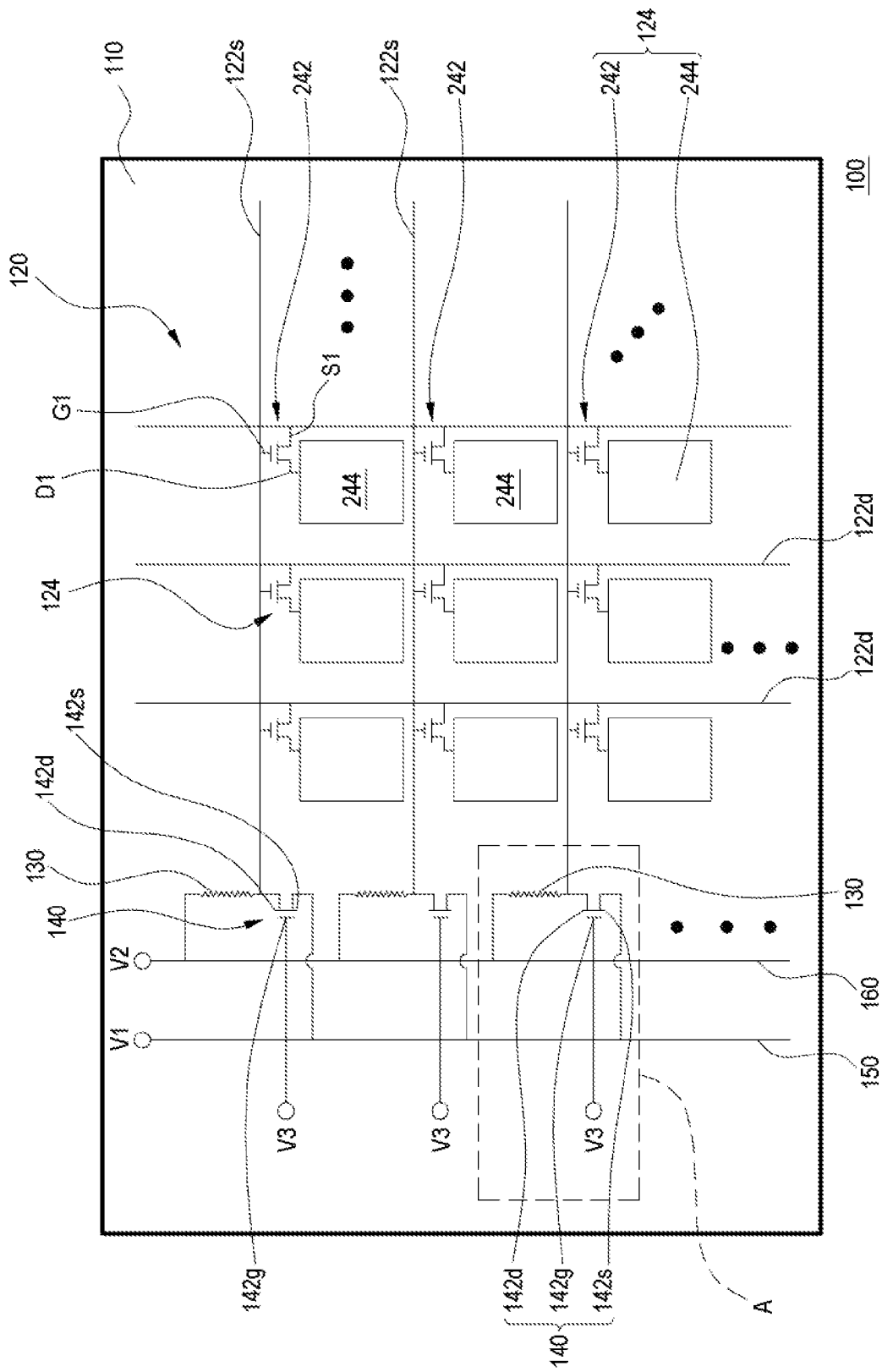
FIG. 1A is a circuit diagram of a transistor array substrate according to an embodiment of the present invention.

FIG. 1A is a circuit diagram of a transistor array substrate according to an embodiment of the present invention. Referring to FIG. 1A, the transistor array substrate 100 is applicable to an LCD and includes a substrate 110, a pixel array 120, a plurality of resistors 130, and a plurality of semiconductor transistors 140. The pixel array 120, the resistors 130, and the semiconductor transistors 140 are all disposed on the substrate 110, and the semiconductor transistors 140 and the resistors 130 are all electrically connected to the pixel array 120.

Specifically, the pixel array 120 includes a plurality of scan lines 122s, a plurality of data lines 122d, and a plurality of pixel units 124. Each pixel unit 124 includes a pixel transistor 242 and a pixel electrode 244. All of the pixel transistors 242 may be semiconductor transistors and may be thin film transistors (TFTs). Each pixel electrodes 244 may be a transparent conductive layer, such as an indium tin oxide (ITO) layer or an indium zinc oxide (IZO) layer.

The data lines 122d and the scan lines 122s cross each other. Each pixel transistor 242 is electrically connected to one of the scan lines 122s and one of the data lines 122d, and each pixel electrode 244 is electrically connected to one of the pixel transistors 242. Specifically, the pixel transistor 242 may further be a field-effect transistor (FET), so that the pixel transistor 242 includes a gate G1, a drain D1, and a source S1. The gate G1 is connected to the scan line 122s, the source S1 is connected to the data line 122d, and the drain D1 is connected to the pixel electrode 244.

The pixel transistors 242 each have a threshold voltage. When a voltage transmitted by one of the scan lines 122s to the gate G1 is higher than the threshold voltage, the pixel transistor 242 electrically connected to the scan line 122s is turned on, and a pixel voltage from the data line 122d is input to the pixel electrode 244. In this manner, an electric field is generated between the pixel electrode 244 and a color filter substrate (not shown), so that liquid crystal molecules are driven to rotate, to prompt the images displayed by the LCD.

Each resistor 130 is electrically connected to one of the scan lines 122s and is a winding wire, a wire having different widths, or a transistor which the source and the gate are connected to each other. Each semiconductor transistor 140 is electrically connected to one of the scan lines 122s and one of the resistors 130. Besides, a first voltage V1 is input to the semiconductor transistors 140, and a second voltage V2 is input to the resistors 130. In addition, the scan lines 122s can receive the first voltage V1 and the second voltage V2.

The second voltage V2 is higher than the first voltage V1, and the second voltage V2 is higher than the threshold voltage of the pixel transistor 242. The first voltage V1 is lower than the threshold voltage of the pixel transistor 242. Thus, when the scan lines 122s receive the first voltage V1, the pixel transistors 242 will be in an off-state, and in this time, a pixel voltage is generally not input to the pixel electrodes 244. When the scan lines 122s receive the second voltage V2, the pixel transistors 242 are in an on-state, and in this time, a pixel voltage may be input to the pixel electrodes 244.

Each semiconductor transistor 140 may be a TFT and may further be an FET, so that each semiconductor transistor 140 may also include a gate 142g, a source 142s, and a drain 142d. The gate 142g is used for receiving a pulse signal V3, the source 142s is used for receiving the first voltage V1, and the drain 142d is electrically connected to the resistors 130 and the scan lines 122s. The pulse signal V3 may be output by a driver circuit, and the driver circuit may be an integrated circuit (IC).

The transistor array substrate 100 may further include a first wiring ISO and a second wiring 160. Both the first wiring 150 and the second wiring 160 are disposed on the substrate 110. The first wiring 150 is electrically connected to the semiconductor transistors 140, and the second wiring 160 is electrically connected to the resistors 130, as shown in FIG. 1A. Moreover, the first wirings 150 and the second wiring 160 may be arranged side by side, and both may be arranged side by side with the data lines 122d.

For example, the first voltage V1 and the second voltage V2 are provided by a driver circuit, and the driver circuit may be an IC. Both the first wiring 150 and the second wiring 160 may be connected to the driver circuit, and the first wiring 150 transmits the first voltage V1 to the semiconductor transistors 140. The second wiring 160 transmits the second voltage V2 to the resistors 130. Thereby, the scan lines 122s can receive the first voltage V1 and the second voltage V2.

Figure 1B:
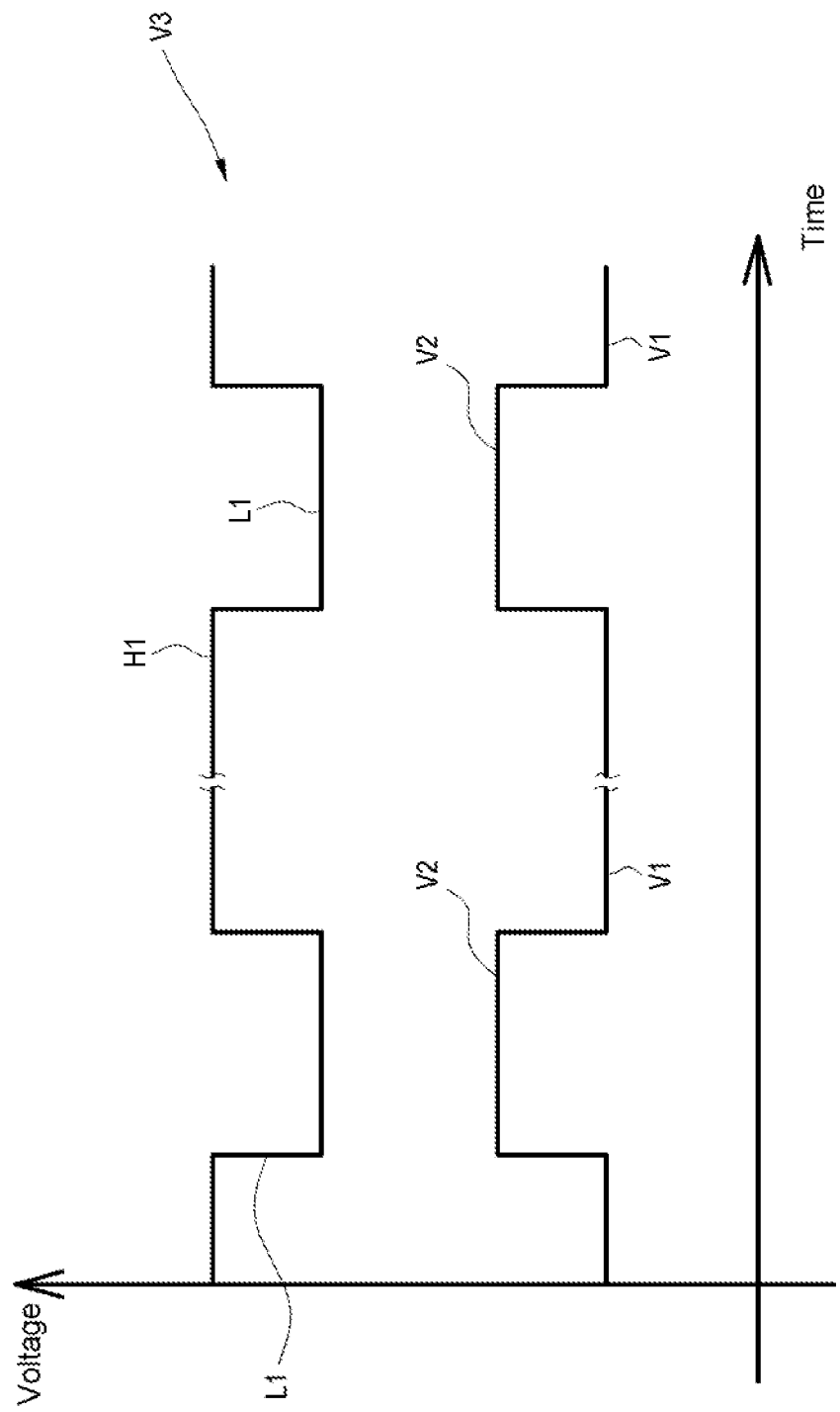
FIG. 1B is a timing chart of voltages transmitted by scan lines and within a pulse signal respectively in an area A according to FIG. 1A.

FIG. 1B is a timing chart of voltages transmitted by scan lines and within a pulse signal respectively in an area A according to FIG. 1A. Referring to FIG. 1A and FIG. 1B, the pulse signal V3 has a low-voltage pulse L1 and a high-voltage pulse H1. The voltage of the low-voltage pulse L1 is lower than the threshold voltage of the semiconductor transistor 140, and the voltage of the high-voltage pulse H1 is higher than the threshold voltage of the semiconductor transistor 140.

Thus, when the gate 142g of the semiconductor transistor 140 receives the low-voltage pulse L1, the semiconductor transistor 140 will be in an off-state, so that the scan line 122s can receive the second voltage V2, and the pixel voltage is input to the pixel electrode 244 thereby.

When the gate 142g of the semiconductor transistor 140 receives the high-voltage pulse H1, the semiconductor transistor 140 will be in an on-state. In this time, both the source 142s and the drain 142d are in an electrically conductive state, and the scan line 122s receives the first voltage V1.

As can be known, when one of the semiconductor transistors 140 receives the high-voltage pulse H1, the scan line 122s electrically connected to the semiconductor transistor 140 outputs the first voltage V1 to turn off the pixel transistor 242. When one of the semiconductor transistors 140 receives the low-voltage pulse L1, the scan line 122s electrically connected to the semiconductor transistor 140 outputs the second voltage V2 to turn on the pixel transistor 242. Thereby, a semiconductor transistor 140 and a resistor 130 electrically connected to each other form an inverter.

Figure 1C:
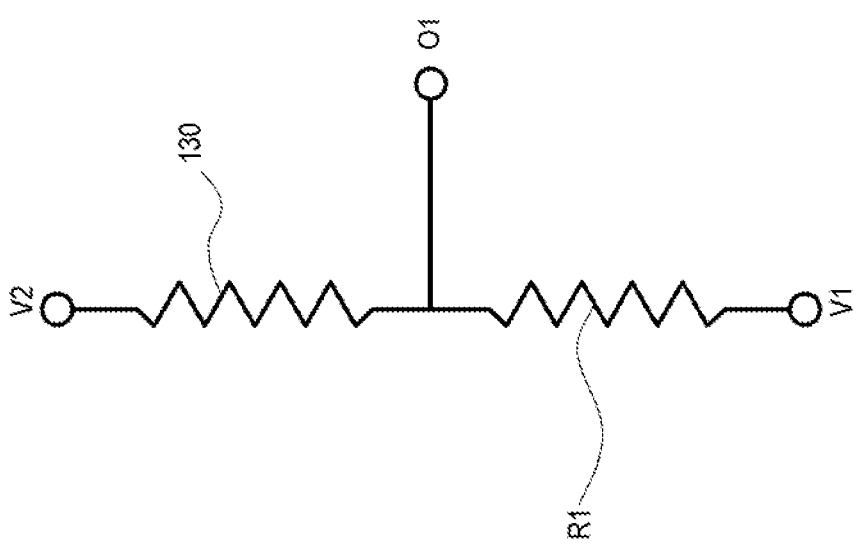
FIG. 1C is an equivalent circuit diagram of the area A in FIG. 1A.

FIG. 1C is an equivalent circuit diagram of the area A in FIG. 1A, in which a resistor R1 is an internal resistance of the semiconductor transistor 140, and an endpoint O1 is an input end of the scan line 122s. Referring to FIG. 1A and FIG. 1C, the electron mobility in the semiconductor transistor 140 changes by the temperature. When the semiconductor transistor 140 is in a low-temperature environment, the electron mobility falls, and the resistance value of the resistor R1 is increased.

It can be seen from FIG. 1C that the resistor R1 is connected to the resistors 130 in series, and thus a current through the resistor R1 substantially has the same value as a current through the resistors 130. According to Ohm's law and Kirchhoff's current law, the following Formula (1) can be derived:

$$Vo=(Vh \times R1)/(R1+R2) \quad \text{Formula (1)}$$

Vo is the voltage value on the endpoint O1 and equals the voltage value of the second voltage V2 after passing through the resistors 130. Vh is a difference between the second voltage V2 and the first voltage V1. R2 is the resistance value of the resistors 130, and R1 is the resistance value of the resistor R1. Both R2 and Vh are constant.

As can be known from Formula (I), when the resistance value of the resistor R1 is increased, the voltage value of the endpoint O1 (that is, Vo) also rises. Thus, even if the transistor array substrate 100 is in a low-temperature environment, the scan line 122s can still receive the second voltage V2 with high voltage. In this manner, the current received by the liquid crystal capacity is increased, and the charging capability of the pixel transistor 242 to the liquid crystal capacities is improved, thereby reducing the happening of inadequate charging in the liquid crystal capacities.

To sum up, the semiconductor transistors and the resistors included in the transistor array substrate according to the present invention form a plurality of inverters electrically connected to the scan lines respectively. In the equivalent circuit, the internal resistance of the semiconductor transistor is connected to the resistor in series, so that even if the transistor array substrate is in a low-temperature environment, the present invention can improve the charging capability of the pixel transistor to the liquid crystal capacities. Therefore, when the LCD is in a low-temperature environment, the present invention can reduce the happening of inadequate charging in the liquid crystal capacities.

The present invention are described with reference to the above preferred embodiments, but not intended to limit the present invention. Any modifications or equivalent replacements made by persons skilled in the art shall fall within the protection scope of the present invention, as long as such modifications and replacements do not depart from the spirit and scope of the present invention.

What is claimed is:

1. A transistor array substrate, comprising:
   a substrate;
   a pixel array, disposed on the substrate, and comprising:
      a plurality of scan lines, wherein each scan line receives either a first voltage or a second voltage, and the second voltage is higher than the first voltage; and
      a plurality of pixel units, wherein each pixel unit comprises a pixel transistor;
   a plurality of resistors, disposed on the substrate, wherein each resistor is electrically connected to one of the scan lines; and a plurality of semiconductor transistors, disposed on the substrate and located outside the pixel array, wherein each semiconductor transistor controls whether to output the first voltage or the second voltage by electrically connecting to one of the scan lines and one of the resistors.

2. The transistor array substrate according to claim 1, wherein the pixel array further comprises:

a plurality of data lines, crossing the scan lines;

wherein the plurality of pixel units are electrically connected to the scan lines and the data lines.

3. The transistor array substrate according to claim 2, further comprising:

a first wiring, disposed on the substrate and electrically connected to the semiconductor transistors, wherein the first wiring is capable of transmitting the first voltage to the semiconductor transistors; and a second wiring, disposed on the substrate and electrically connected to the resistors, wherein the second wiring is capable of transmitting the second voltage to the resistors.

4. The transistor array substrate according to claim 3, wherein the first wiring, and the second wiring are arranged side by side, and both are side by side with the data lines.

5. The transistor array substrate according to claim 3, wherein each semiconductor transistor is a field effect transistor (FET) and comprises:

a gate, adapted to receive a pulse signal;

a source, electrically connected to the first wiring; and a drain, electrically connected to the resistor and the scan line.

6. The transistor array substrate according to claim 2, wherein:

the pixel transistor are electrically connected to one of the scan lines and one of the data lines; and each pixel unit further comprises a pixel electrode, electrically connected to the pixel transistor.

7. The transistor array substrate according to claim 6, wherein both the pixel transistors and the semiconductor transistors are thin film transistors (TFTs).

\* \* \* \* \*